(12) United States Patent
Han et al.

(10) Patent No.: US 10,903,814 B2
(45) Date of Patent: Jan. 26, 2021

(54) BULK ACOUSTIC WAVE RESONATOR

(71) Applicant: Samsung Electro-Mechanics Co., Ltd., Suwon-si (KR)

(72) Inventors: Won Han, Suwon-si (KR); Chang Hyun Lim, Suwon-si (KR); Yong Suk Kim, Suwon-si (KR); Seung Hun Han, Suwon-si (KR); Sung Jun Lee, Suwon-si (KR); Sang Kee Yoon, Suwon-si (KR); Tae Yoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 318 days.

(21) Appl. No.: 15/789,024

(22) Filed: Oct. 20, 2017

(65) Prior Publication Data

US 2018/0152168 A1  May 31, 2018

(30) Foreign Application Priority Data

Nov. 30, 2016 (KR) .................. 10-2016-0161699
May 24, 2017 (KR) .................. 10-2017-0064021

(51) Int. Cl.
*H03H 9/02* (2006.01)
*H03H 9/17* (2006.01)
(Continued)

(52) U.S. Cl.
CPC ....... *H03H 9/02007* (2013.01); *H01L 41/047* (2013.01); *H03H 9/02015* (2013.01); *H03H 9/02118* (2013.01); *H03H 9/02157* (2013.01); *H03H 9/17* (2013.01); *H03H 9/173* (2013.01); *H03H 9/174* (2013.01); *H03H 9/54* (2013.01)

(58) Field of Classification Search
CPC combination set(s) only.
See application file for complete search history.

(56) References Cited

U.S. PATENT DOCUMENTS

| 6,396,200 | B2 | 5/2002 | Misu et al. | |
|---|---|---|---|---|
| 8,902,023 | B2 | 12/2014 | Choy et al. | |
| 2001/0045793 | A1* | 11/2001 | Misu | H03H 3/04 310/364 |
| 2002/0014808 | A1* | 2/2002 | Misu | H03H 9/174 310/312 |

(Continued)

FOREIGN PATENT DOCUMENTS

| CN | 106059524 A | 10/2016 |
|---|---|---|
| JP | 2013-34156 A | 2/2013 |

(Continued)

OTHER PUBLICATIONS

Korean Office Action dated Sep. 20, 2018, in corresponding Korean Application No. 10-2017-0064021 (4 pages in English, 4 pages in Korean).

(Continued)

*Primary Examiner* — Bryan P Gordon
(74) *Attorney, Agent, or Firm* — NSIP Law

(57) ABSTRACT

A bulk acoustic wave resonator includes a membrane layer, together with a substrate, forming a cavity, a lower electrode disposed on the membrane layer, a piezoelectric layer disposed on a flat surface of the lower electrode and an upper electrode covering a portion of the piezoelectric layer. An overall region at a side of the piezoelectric layer is exposed to the air. The side of the piezoelectric layer has a gradient of 65° to 90° with respect to a top surface of the lower electrode.

8 Claims, 5 Drawing Sheets

(51) Int. Cl.
*H01L 41/047* (2006.01)
*H03H 9/54* (2006.01)

(56) References Cited

U.S. PATENT DOCUMENTS

| | | | | |
|---|---|---|---|---|
| 2007/0252476 | A1* | 11/2007 | Iwaki | H03H 3/04 |
| | | | | 310/320 |
| 2010/0148636 | A1* | 6/2010 | Nishihara | H03H 9/02157 |
| | | | | 310/365 |
| 2013/0106248 | A1* | 5/2013 | Burak | H03H 9/173 |
| | | | | 310/360 |
| 2013/0147577 | A1* | 6/2013 | Nishihara | H03H 9/174 |
| | | | | 333/133 |
| 2015/0349743 | A1* | 12/2015 | Burak | H01L 41/107 |
| | | | | 310/313 R |
| 2016/0163954 | A1 | 6/2016 | Shin et al. | |
| 2016/0301380 | A1 | 10/2016 | Lee et al. | |

FOREIGN PATENT DOCUMENTS

| | | |
|---|---|---|
| KR | 10-2007-0106430 A | 11/2007 |
| KR | 10-2013-0061399 A | 6/2013 |
| KR | 10-2013-0064334 A | 6/2013 |
| KR | 10-2016-0069263 A | 6/2016 |
| WO | WO 2013/081327 A1 | 6/2013 |
| WO | WO 2013/085136 A1 | 6/2013 |

OTHER PUBLICATIONS

Korean Office Action dated Apr. 3, 2018, in corresponding Korean Application No. 10-2017-0064021 (6 pages in English, 5 pages in Korean).

Chinese Office Action dated Oct. 30, 2020 in counterpart Chinese Patent Application No. 201711211798.4 (12 pages in English and 9 pages in Chinese).

* cited by examiner

BULK ACOUSTIC WAVE RESONATOR

CROSS-REFERENCE TO RELATED APPLICATIONS

This application claims the benefit under 35 USC 119(a) of Korean Patent Application Nos. 10-2016-0161699 filed on Nov. 30, 2016, and 10-2017-0064021 filed on May 24, 2017, in the Korean Intellectual Property Office, the entire disclosures of which are incorporated herein by reference for all purposes.

BACKGROUND

1. Field

The present disclosure relates to a bulk acoustic wave resonator.

2. Description of Related Art

In general, a bulk acoustic wave (BAW) filter is a core element that passes a selected frequency band among radio frequency (RF) signals and blocks unselected frequency bands among the RF signals in a front end module of a smartphone, a tablet, and the like. As demands for mobile devices that contain a bulk acoustic wave filter increase, demand for bulk acoustic wave filter has increased accordingly.

The BAW filter includes bulk acoustic wave (BAW) resonators. If a quality coefficient (Q performance) of the bulk acoustic wave resonator is good, the capability of the BAW filter of selecting only a desired band is improved, and insertion loss and attenuation performance are improved.

Resonance energy being confined in an active area by forming a frame around the resonator and reflecting a lateral wave generated at the time of resonance in the resonator improves the quality coefficient of the bulk acoustic wave resonator.

In general, the frame is formed to be thicker than the active area using the same material as an upper electrode. In a case in which the frame is formed, however, other performance aspects may be degraded due to the active area occupied by the frame. Further, noise may occur in a wide band region due to frame resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a membrane layer, together with a substrate, forming a cavity, a lower electrode disposed on the membrane layer, a piezoelectric layer disposed on a flat surface of the lower electrode and an upper electrode covering a portion of the piezoelectric layer. An overall region of a side of the piezoelectric layer is exposed to the air. The side of the piezoelectric layer is inclined at an angle of 65° to 90° with respect to a top surface of the lower electrode.

A reflection loss improving part may be formed on one or both of the lower electrode and the upper electrode.

The upper electrode may include a support member disposed on the membrane layer and spaced apart from the lower electrode, an extending part extended from the support member and spaced apart from the piezoelectric layer, and an electrode layer part extended from the extending part and covering a top surface of the piezoelectric layer.

The reflection loss improving part may be disposed on the electrode layer part. The electrode layer part may include a step shape, the step shape including the reflection loss improving part.

The electrode layer part may have an end that does not coincide with the side of the piezoelectric layer, the end including a reflection loss improving part.

The end of the electrode layer part may include an inclined surface.

The end of the electrode layer part may be disposed on an inner side of the piezoelectric layer.

The lower electrode may include an end of the lower electrode that does not coincide with the side of the piezoelectric layer, the end including the reflection loss improving part.

The end of the lower electrode may include an inclined surface.

The end of the lower electrode may be disposed on an inner side of the piezoelectric layer.

A convex portion of the cavity may be defined by the membrane layer.

The piezoelectric layer may be disposed on the lower electrode on a flat surface of the convex portion.

In another general aspect, a bulk acoustic wave resonator includes a membrane layer, together with a substrate, forming a cavity, a lower electrode disposed on the membrane layer, a piezoelectric layer disposed on a flat surface of the lower electrode, an upper electrode covering a portion of the piezoelectric layer, and spaced apart from a side of the piezoelectric layer, and a residual sacrificial layer covering a portion of the side of the piezoelectric layer.

The upper electrode may include a support member disposed on the membrane layer and spaced apart from the lower electrode, an extending part extended from the support member and spaced apart from the piezoelectric layer, and an electrode layer part extended from the extending part and covering a top surface of the piezoelectric layer.

The residual sacrificial layer may be formed in a space defined by the piezoelectric layer, the support member, the extending part, and the membrane layer.

The residual sacrificial layer may surround the side of the piezoelectric layer.

Other features and aspects will be apparent from the following detailed description, the drawings, and the claims.

BRIEF DESCRIPTION OF THE DRAWINGS

The above and other aspects, features and other advantages of the present disclosure will be more clearly understood from the following detailed description taken in conjunction with the accompanying drawings.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
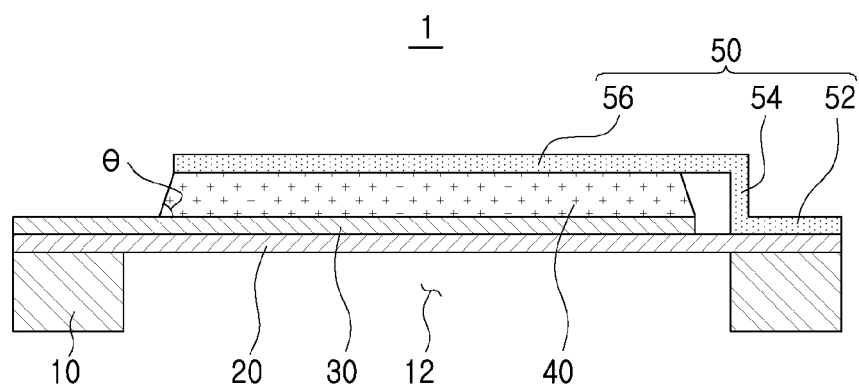
FIG. 1 is a schematic configuration view illustrating an example of a bulk acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
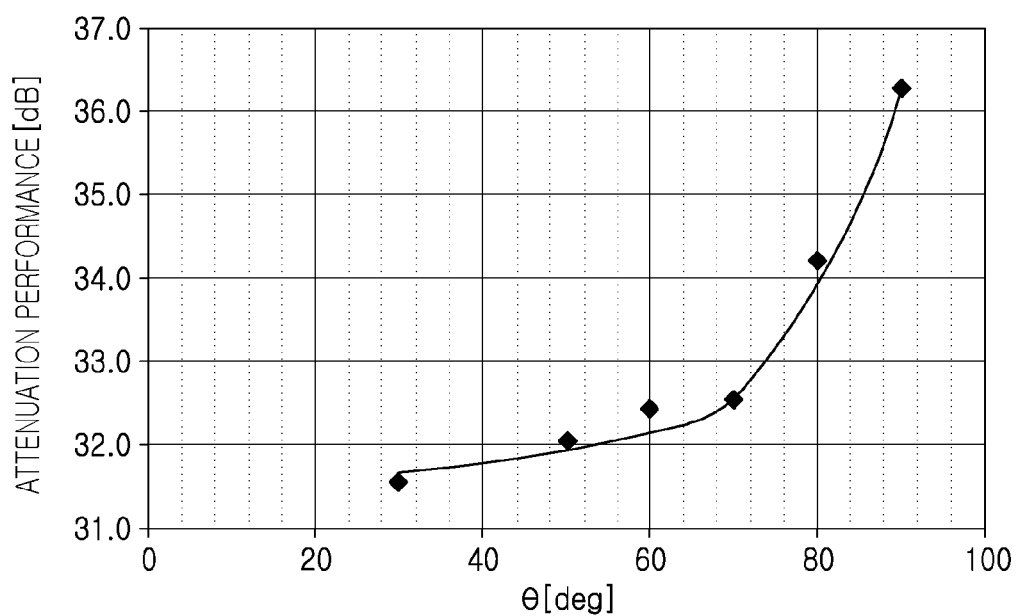
FIG. 2 is a graph illustrating an example of an effect of a bulk acoustic wave resonator.

FIG. 1 is a schematic configuration view illustrating an example of a bulk acoustic wave resonator and FIG. 2 is a graph illustrating an example of an effect of the bulk acoustic wave resonator.

Referring to FIGS. 1 and 2, a bulk acoustic wave resonator 1 includes a substrate 10, a membrane layer 20, a lower electrode 30, a piezoelectric layer 40, and an upper electrode 50.

The substrate 10 may include stacked silicon. For example, a silicon wafer may be used as the substrate. A protective layer (not shown) may be provided on the substrate 10.

The substrate 10, together with a membrane layer 20, forms a cavity 12.

The membrane layer 20 is formed on a top surface of the substrate 10 and forms the cavity 12 together with the substrate 10. The membrane layer 20 may prevent the lower electrode 30 from being damaged by etching gas when a sacrificial layer (not shown) is removed during the manufacturing of the bulk acoustic wave resonator 1. As an example, the membrane layer 20 is formed of a material having low reactivity with halide-based etching gas. For example, the membrane layer 20 is formed of a material containing silicon nitride (SiN) or silicon oxide ($SiO_2$).

The lower electrode 30 is disposed on the membrane layer 20. The lower electrode 30 is formed on the membrane layer 20 such that a portion of the lower electrode layer 30 is disposed above the cavity 12. As an example, the lower electrode 30 is formed of a conductive material such as molybdenum (Mo), ruthenium (Ru), tungsten (W), iridium (Ir), platinum (Pt), and the like, or alloys thereof.

The lower electrode 30 may be an input electrode that inputs an electrical signal such as a radio frequency (RF) signal, or the like, or an output electrode.

The piezoelectric layer 40 is formed on a flat surface of the lower electrode 30 so as to be disposed above the cavity 12. The piezoelectric layer 40 is disposed such that an overall region of a side of the piezoelectric layer 40 is exposed to the air. The side of the piezoelectric layer 40 is inclined at an angle θ of 65° to 90° with respect to a top surface of the lower electrode 30.

Accordingly, a lateral wave that propagates in the piezoelectric layer 40 may encounter the air at the side of the piezoelectric layer 40 and may increase a reflection coefficient.

During resonance driving of the bulk acoustic wave resonator 1, the lateral wave having a plurality of modes may occur, and the lateral wave may propagate in a lateral direction in a form of various modes (S1, A1, S0, A0 modes, etc.) at an antiresonance frequency, which causes a loss of energy. Accordingly, the bulk acoustic wave resonator 1 may sequentially reflect these modes by exposing the side of the piezoelectric layer 40 to the air.

Since the side of the piezoelectric layer 40 is inclined at the angle θ of 65° to 90° with respect to the top surface of the lower electrode 30, attenuation performance may be improved as illustrated in FIG. 2, thereby improving performance coefficient Q.

The upper electrode 50 covers at least a portion of the piezoelectric layer 40, and is formed such that an overall region of the side of the piezoelectric layer 40 is exposed to the air. The upper electrode 50 has a step shape. As an example, the upper electrode 50 includes a support member 52 formed on the membrane layer 20 to be spaced apart from the lower electrode 30, an extending part 54 extended from the support member 52 and spaced apart from the piezoelectric layer 40, and an electrode layer part 56 extended from the extending part 54 and covering a top surface of the piezoelectric layer 40.

The upper electrode 50 may be formed of a conductive material such as molybdenum (Mo), ruthenium (Ru), tungsten (W), iridium (Ir), platinum (Pt), or the like, or alloys thereof, similarly to the lower electrode 30.

The upper electrode 50 may be an input electrode that inputs an electrical signal such as a radio frequency (RF) signal, or the like, or an output electrode. That is, in a case in which the lower electrode 30 is used as the input electrode, the upper electrode 50 may be the output electrode, and in a case in which the lower electrode 30 is the output electrode, the upper electrode 50 may be the input electrode.

An active area is an area in which all of the lower electrode 30, the piezoelectric layer 40, and the upper electrode 50 overlap with each other.

As described above, since the overall region of the side of the piezoelectric layer 40 is exposed to the air, and the side of the piezoelectric layer 40 is inclined at the angle θ of 65° to 90° with respect to the top surface of the lower electrode 30, reflection loss of the lateral wave may be reduced.

Hereinafter, modified examples of the bulk acoustic wave resonator described above will be described with reference to the accompanying drawings.

Figure 3:
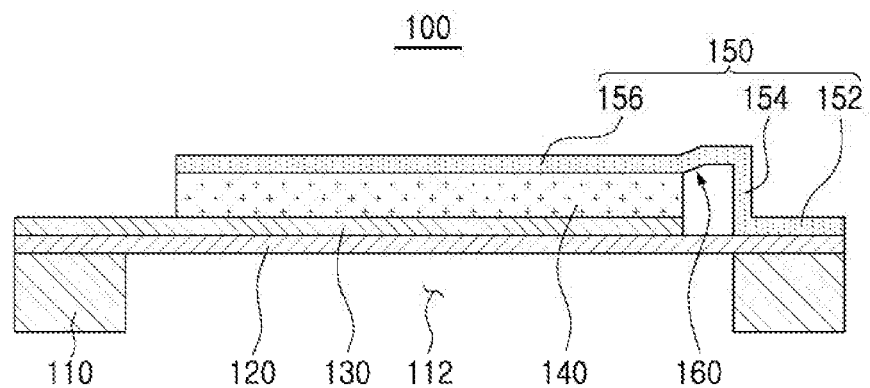
FIG. 3 is a schematic configuration view illustrating an example of a bulk acoustic wave resonator.

FIG. 3 is a schematic configuration view illustrating an example of a bulk acoustic wave resonator.

Referring to FIG. 3, a bulk acoustic wave resonator 100 includes a substrate 110, a membrane layer 120, a lower electrode 130, a piezoelectric layer 140, and an upper electrode 150. The membrane layer 120 forms a cavity 112 together with the substrate 110.

Since the substrate 110, the membrane layer 120, and the lower electrode 130 are the same as the substrate 10, the membrane layer 20, and the lower electrode 30 described above with reference to FIG. 1, a detailed description thereof will be omitted herein.

The piezoelectric layer 140 is formed on a flat surface of the lower electrode 130 so as to be disposed above the cavity 112. The piezoelectric layer 140 is disposed such that a side of the piezoelectric layer 140 is exposed to the air.

Accordingly, a lateral wave that propagates in the piezoelectric layer 140 may encounter the air at the side of the piezoelectric layer 140 and may increase a reflection coefficient.

During a resonance driving of the bulk acoustic wave resonator 100, the lateral wave having a plurality of modes may occur, and the lateral wave may propagate in a lateral direction in a form of various modes (S1, A1, S0, A0 modes, etc.) at an antiresonance frequency, which causes loss of energy. Accordingly, the bulk acoustic wave resonator 100 as shown in FIG. 3 may sequentially reflect these modes by exposing the side of the piezoelectric layer 140 to the air.

The upper electrode 150 covers at least a portion of the piezoelectric layer 140, and is formed such that the side of the piezoelectric layer 140 is exposed to the air. The upper electrode 150 has a step shape. The upper electrode 150 includes a support member 152 formed on the membrane layer 120 to be spaced apart from the lower electrode 130, an extending part 154 extended from the support member 152 and spaced apart from the piezoelectric layer 140, and an electrode layer part 156 extended from the extending part 154 and covering a top surface of the piezoelectric layer 140.

The electrode layer part 156 is stepped to form a reflection loss improving part 160. A portion of the electrode layer part 156 connected to the extending part 154 of the electrode layer part 156 may be disposed above a remaining portion of the electrode layer part 156 to form the reflection loss improving part 160. In this configuration, the reflection loss may be reduced through the electrode layer part 156 that is stepped.

The upper electrode 150 may be formed of a conductive material such as molybdenum (Mo), ruthenium (Ru), tungsten (W), iridium (Ir), platinum (Pt), or the like, or alloys thereof, similarly to the lower electrode 130.

The upper electrode 150 may be an input electrode that inputs an electrical signal such as a radio frequency (RF) signal, or the like, or an output electrode. That is, in a case in which the lower electrode 130 is the input electrode, the upper electrode 150 may be the output electrode, and in a case in which the lower electrode 130 is the output electrode, the upper electrode 150 may be the input electrode.

As described above, the reflection loss of the lateral wave may be reduced through the reflection loss improving part 160.

Figure 4:
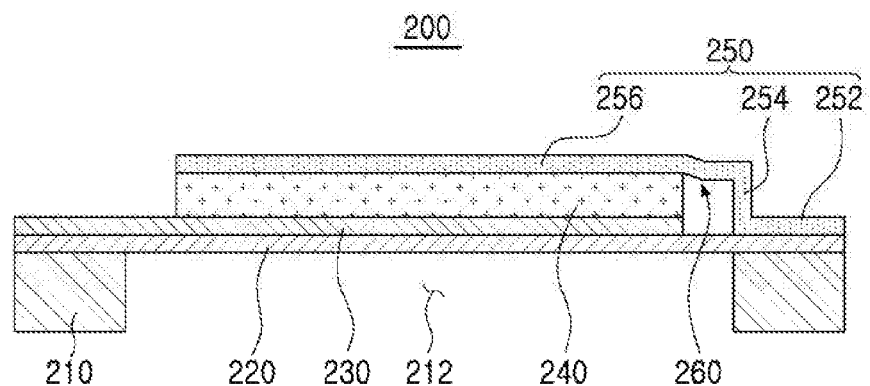
FIG. 4 is a schematic configuration view illustrating an example of a bulk acoustic wave resonator.

FIG. 4 is a schematic configuration view illustrating an example of a bulk acoustic wave resonator.

Referring to FIG. 4, a bulk acoustic wave resonator 200 includes a substrate 210, a membrane layer 220, a lower electrode 230, a piezoelectric layer 240, and an upper electrode 250. The membrane layer 220 forms a cavity 212 together with the substrate 210.

Since the substrate 210, the membrane layer 220, the lower electrode 230, and the piezoelectric layer 240 are the same as the substrate 10, the membrane layer 20, the lower electrode 30, and the piezoelectric layer 140 described above with reference to FIGS. 1 and 3, a detailed description thereof will be omitted herein.

The upper electrode 250 covers at least a portion of the piezoelectric layer 240, and is formed such that the side of the piezoelectric layer 240 is exposed to the air. The upper electrode 250 has a step shape. As an example, the upper electrode 250 includes a support member 252 formed on the membrane layer 220 spaced apart from the lower electrode 230, an extending part 254 extended from the support member 252 and spaced apart from the piezoelectric layer 240, and an electrode layer part 256 extended from the extending part 254 and covering a top surface of the piezoelectric layer 240.

The electrode layer part 256 is stepped to form a reflection loss improving part 260. A portion of the electrode layer part 256 connected to the extending part 254 of the electrode layer part 256 is disposed below a remaining portion of the electrode layer part 256 to form the reflection loss improving part 260. That is, the reflection loss may be reduced through the electrode layer part 256 that is stepped.

The upper electrode 250 may be formed of a conductive material such as molybdenum (Mo), ruthenium (Ru), tungsten (W), iridium (Ir), platinum (Pt), or the like, or alloys thereof, similarly to the lower electrode 230.

The upper electrode 250 may be an input electrode that inputs an electrical signal such as a radio frequency (RF) signal, or the like, or an output electrode. That is, in a case in which the lower electrode 230 is the input electrode, the upper electrode 250 may be the output electrode, and in a case in which the lower electrode 230 is the output electrode, the upper electrode 250 may be the input electrode.

As described above, the reflection loss of the lateral wave may be reduced through the reflection loss improving part 260.

Figure 5:
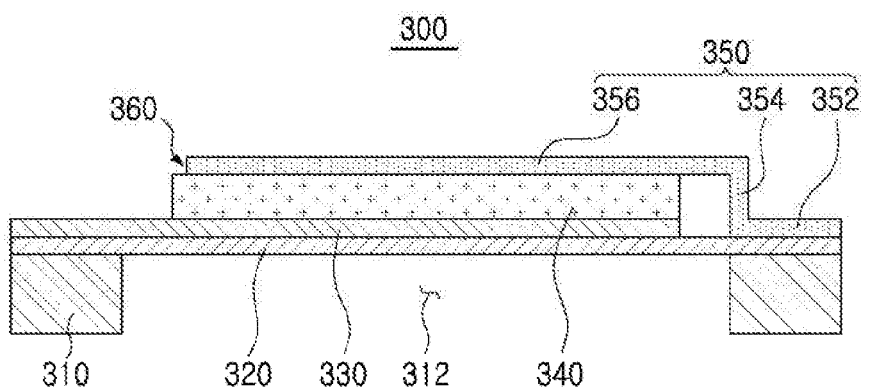
FIG. 5 is a schematic configuration view illustrating an example of a bulk acoustic wave resonator.

FIG. 5 is a schematic configuration view illustrating an example of a bulk acoustic wave resonator.

Referring to FIG. 5, a bulk acoustic wave resonator 300 includes a substrate 310, a membrane layer 320, a lower electrode 330, a piezoelectric layer 340, and an upper electrode 350. The membrane layer 320 forms a cavity 312 together with the substrate 310.

Since the substrate 310, the membrane layer 320, the lower electrode 330, and the piezoelectric layer 340 are the same as the substrate 10, the membrane layer 20, the lower electrode 30, and the piezoelectric layer 140 described above with reference to FIGS. 1 and 3, a detailed description thereof will be omitted herein.

The upper electrode 350 covers at least a portion of the piezoelectric layer 340, and is formed such that the side of the piezoelectric layer 340 is exposed to the air. The upper electrode 350 has a step shape. The upper electrode 350 includes a support member 352 formed on the membrane layer 320 to be spaced apart from the lower electrode 330, an extending part 354 extended from the support member 352 and spaced apart from the piezoelectric layer 340, and an electrode layer part 356 extended from the extending part 354 and covering a top surface of the piezoelectric layer 340.

The electrode layer part 356 has an end that does not coincide with the side of the piezoelectric layer 340 to form a reflection loss improving part 360. As an example, the end of the electrode layer part 356 is disposed inward from the side of the piezoelectric layer 340 to form the reflection loss improving part 360. That is, the reflection loss may be reduced by the electrode layer part 356 being disposed inward from the side of the piezoelectric layer 340. In other words, reflection performance of the lateral wave may be improved by a boundary difference between the side of the piezoelectric layer 340 and the end of the electrode layer part 356 through the reflection loss improving part 360 as described above.

The upper electrode 350 may be formed of a conductive material such as molybdenum (Mo), ruthenium (Ru), tungsten (W), iridium (Ir), platinum (Pt), or the like, or alloys thereof, similarly to the lower electrode 330.

The upper electrode 350 may be an input electrode that inputs an electrical signal such as a radio frequency (RF) signal, or the like, or an output electrode. That is, in a case in which the lower electrode 330 is the input electrode, the upper electrode 350 may be the output electrode, and in a case in which the lower electrode 330 is the output electrode, the upper electrode 350 may be the input electrode.

As described above with reference to FIG. 5, the reflection loss of the lateral wave may be reduced.

Figure 6:
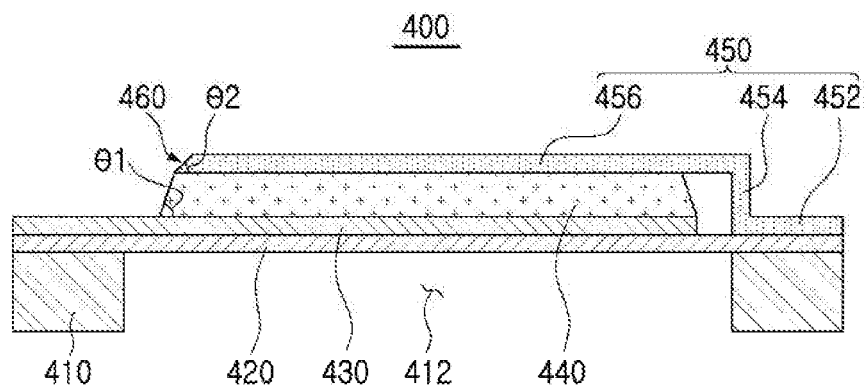
FIG. 6 is a schematic configuration view illustrating an example of a bulk acoustic wave resonator.

FIG. 6 is a schematic configuration view illustrating an example of a bulk acoustic wave resonator.

Referring to FIG. 6, a bulk acoustic wave resonator 400 includes a substrate 410, a membrane layer 420, a lower electrode 430, a piezoelectric layer 440, and an upper electrode 450. The membrane layer 420 forms a cavity 412 together with the substrate 410.

Since the substrate 410, the membrane layer 420, and the lower electrode 430 are the same as the substrate 10, the membrane layer 20, and the lower electrode 30 described above with reference to FIG. 1, a detailed description thereof will be omitted herein.

The piezoelectric layer 440 is formed on a flat surface of the lower electrode 430 so as to be disposed above the cavity 412. The piezoelectric layer 440 is formed such that a side of the piezoelectric layer 440 is exposed to the air.

Accordingly, a lateral wave that propagates in the piezoelectric layer 440 may encounter the air at the side of the piezoelectric layer 440 and may increase a reflection coefficient.

During resonance driving of the bulk acoustic wave resonator 400, the lateral wave having a plurality of modes may occur, and the lateral wave may propagate in a lateral direction in a form of various modes (S1, A1, S0, A0 modes, etc.) at an antiresonance frequency, which causes loss of energy. Accordingly, the bulk acoustic wave resonator 400 may sequentially reflect these modes by exposing the side of the piezoelectric layer 440 to the air.

The side of the piezoelectric layer 440 is inclined at an angle θ1 of approximately 60° to 90° with respect to a top surface of the lower electrode 430. Accordingly, a reflection coefficient of the lateral wave may be relatively increased.

The upper electrode 450 covers at least a portion of the piezoelectric layer 440, and is formed such that the side of the piezoelectric layer 440 is exposed to the air. The upper electrode 450 has a step shape. The upper electrode 450 includes a support member 452 formed on the membrane layer 420 to be spaced apart from the lower electrode 430, an extending part 454 extended from the support member 452 and spaced apart from the piezoelectric layer 440, and an electrode layer part 456 extended from the extending part 454 and covering a top surface of the piezoelectric layer 440.

The electrode layer part 456 has an end that does not coincide with the side of the piezoelectric layer 440 to form a reflection loss improving part 460. The end of the electrode layer part 456 is inclined inward from the side of the piezoelectric layer 440 to form the reflection loss improving part 460. That is, the reflection loss may be reduced through the electrode layer part 456 having the end that is inclined inward from the side of the piezoelectric layer 440. Reflection performance of the lateral wave may be improved by a boundary difference between the side of the piezoelectric layer 440 and the end of the electrode layer part 456 through the reflection loss improving part 460 as described above.

The end of the electrode layer part 456 may be inclined inward from the side of the piezoelectric layer 440 at an angle θ2 of approximately 60° to 90° with respect to a top surface of the piezoelectric layer 440.

The upper electrode 450 may be formed of a conductive material such as molybdenum (Mo), ruthenium (Ru), tungsten (W), iridium (Ir), platinum (Pt), or the like, or alloys thereof, similarly to the lower electrode 430.

The upper electrode 450 may be an input electrode that inputs an electrical signal such as a radio frequency (RF) signal, or the like, or an output electrode. That is, in a case in which the lower electrode 430 is the input electrode, the upper electrode 450 may be the output electrode, and in a case in which the lower electrode 430 is the output electrode, the upper electrode 450 may be the input electrode.

As described above with reference to FIG. 6, the reflection loss of the lateral wave may be reduced.

Figure 7:
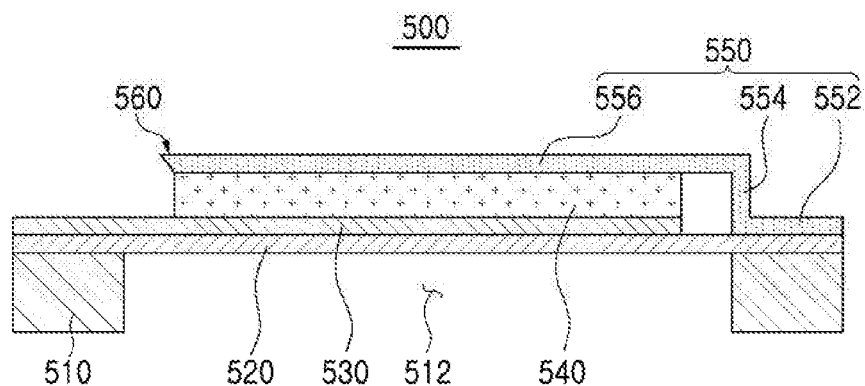
FIG. 7 is a schematic configuration view illustrating an example of a bulk acoustic wave resonator.

FIG. 7 is a schematic configuration view illustrating an example of a bulk acoustic wave resonator.

Referring to FIG. 7, a bulk acoustic wave resonator 500 includes a substrate 510, a membrane layer 520, a lower electrode 530, a piezoelectric layer 540, and an upper electrode 550. The membrane layer 520 forms a cavity 512 together with the substrate 510.

Since the substrate 510, the membrane layer 520, the lower electrode 530, and the piezoelectric layer 540 are the same as the substrate 10, the membrane layer 20, the lower electrode 30, and the piezoelectric layer 140 described above with reference to FIGS. 1 and 3, a detailed description thereof will be omitted herein.

The upper electrode 550 covers at least a portion of the piezoelectric layer 540, and is formed so that the side of the piezoelectric layer 540 is exposed to the air. The upper electrode 550 has a step shape. The upper electrode 550 includes a support member 552 formed on the membrane layer 520 to be spaced apart from the lower electrode 530, an extending part 554 extended from the support member 552 and spaced apart from the piezoelectric layer 540, and an electrode layer part 556 extended from the extending part 554 and covering a top surface of the piezoelectric layer 540.

The electrode layer part 556 has an end that does not coincide with the side of the piezoelectric layer 540 to form a reflection loss improving part 560. The end of the electrode layer part 556 is inclined outward from the side of the piezoelectric layer 540 to form the reflection loss improving part 560. That is, the reflection loss may be reduced through the electrode layer part 556 having the end that is inclined outward from the side of the piezoelectric layer 540. In other words, reflection performance of the lateral wave may be improved by a boundary difference between the side of the piezoelectric layer 540 and the end of the electrode layer part 556 through the reflection loss improving part 560 as described above.

The upper electrode 550 may be formed of a conductive material such as molybdenum (Mo), ruthenium (Ru), tungsten (W), iridium (Ir), platinum (Pt), or the like, or alloys thereof, similarly to the lower electrode 530.

The upper electrode 550 may be an input electrode that inputs an electrical signal such as a radio frequency (RF) signal, or the like, or an output electrode. That is, in a case in which the lower electrode 530 is the input electrode, the upper electrode 550 may be the output electrode, and in a case in which the lower electrode 530 is the output electrode, the upper electrode 550 may be the input electrode.

As described above with reference to FIG. 7, the reflection loss of the lateral wave may be reduced.

Figure 8:
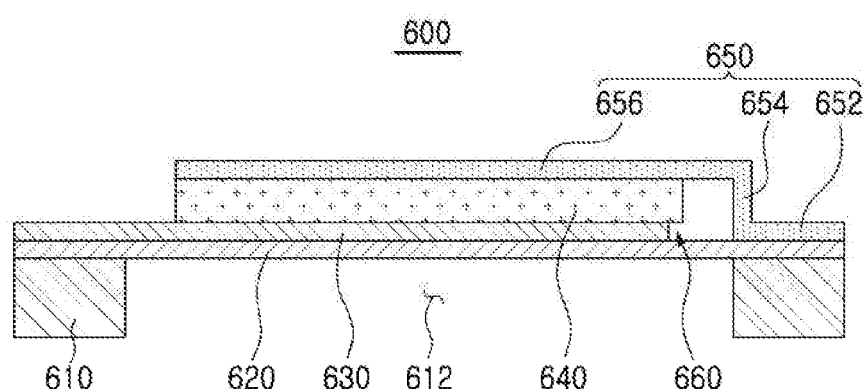
FIG. 8 is a schematic configuration view illustrating an example of a bulk acoustic wave resonator.

FIG. 8 is a schematic configuration view illustrating an example of a bulk acoustic wave resonator.

Referring to FIG. 8, a bulk acoustic wave resonator 600 includes a substrate 610, a membrane layer 620, a lower electrode 630, a piezoelectric layer 640, and an upper electrode 650. The membrane layer 620 forms a cavity 612 together with the substrate 610. The upper electrode 650 includes a support member 652, an extending part 654, and an electrode layer part 656.

Since the substrate 610, the membrane layer 620, the piezoelectric layer 640, and the upper electrode 650 are the same as the substrate 10, the membrane layer 20, the piezoelectric layer 140, and the upper electrode 50 described above with respect to FIGS. 1 and 3, a detailed description thereof will be omitted herein.

The lower electrode 630 is disposed on the membrane layer 620. The lower electrode 630 is formed on the membrane layer 620 such that a portion of the lower electrode 630 is disposed above the cavity 612. The lower electrode 630 has an end that does not coincide with the side of the piezoelectric layer 640 to form a reflection loss improving part 660. The end of the lower electrode 630 is inward from the side of the piezoelectric layer 640 to form the reflection loss improving part 660. That is, the reflection loss may be reduced through the end of the lower electrode 630 that is disposed inward from the side of the piezoelectric layer 640. In other words, reflection performance of the lateral wave may be improved by a boundary difference between the side of the piezoelectric layer 640 and the end of the lower electrode 630 through the reflection loss improving part 660 as described above with reference to FIG. 8.

The lower electrode 630 may be formed of a conductive material such as molybdenum (Mo), ruthenium (Ru), tungsten (W), iridium (Ir), platinum (Pt), and the like, or alloys thereof.

The lower electrode 630 may be an input electrode that inputs an electrical signal such as a radio frequency (RF) signal, or the like, or an output electrode.

As described above with reference to FIG. 8, the reflection loss of the lateral wave may be reduced.

Figure 9:
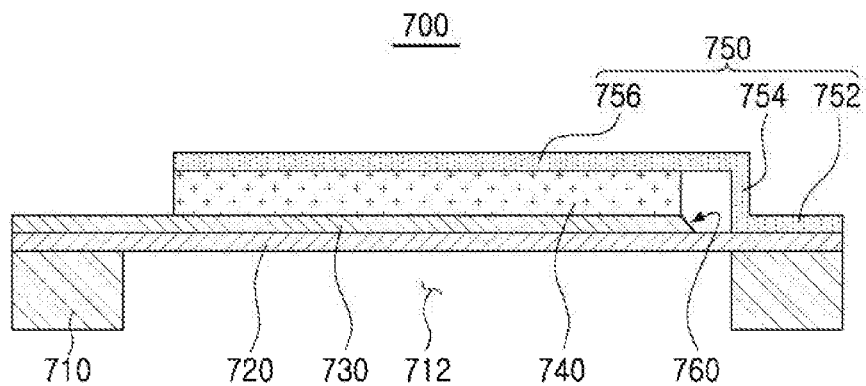
FIG. 9 is a schematic configuration view illustrating an example of a bulk acoustic wave resonator.

FIG. 9 is a schematic configuration view illustrating an example of a bulk acoustic wave resonator.

Referring to FIG. 9, a bulk acoustic wave resonator 700 includes a substrate 710, a membrane layer 720, a lower electrode 730, a piezoelectric layer 740, and an upper electrode 750. The membrane layer 720 forms a cavity 712 together with the substrate 710. The upper electrode 750 includes a support member 752, an extending part 754, and an electrode layer part 756.

Since the substrate 710, the membrane layer 720, the piezoelectric layer 740, and the upper electrode 750 are the same as the substrate 10, the membrane layer 20, the piezoelectric layer 140, and the upper electrode 50 described above with reference to FIGS. 1 and 3, a detailed description thereof will be omitted herein.

The lower electrode 730 is disposed on the membrane layer 720. The lower electrode 730 is formed on the membrane layer 720 such that a portion of the lower electrode 730 is disposed above the cavity 712. The lower electrode 730 has an end that does not coincide with the side of the piezoelectric layer 740 to form a reflection loss improving part 760. The end of the lower electrode 730 is inclined outward from the side of the piezoelectric layer 740 to form the reflection loss improving part 760. That is, the reflection loss may be reduced through the end of the lower electrode 730 that is inclined outward from the side of the piezoelectric layer 740. In other words, reflection performance of the lateral wave may be improved by a boundary difference between the side of the piezoelectric layer 740 and the end of the lower electrode 730 through the reflection loss improving part 760 as described above.

The lower electrode 730 may be formed of a conductive material such as molybdenum (Mo), ruthenium (Ru), tungsten (W), iridium (Ir), platinum (Pt), or the like, or alloys thereof.

The lower electrode 730 may be an input electrode that inputs an electrical signal such as a radio frequency (RF) signal, or the like, or an output electrode.

As described above with reference to FIG. 9, the reflection loss of the lateral wave may be reduced.

Figure 10:
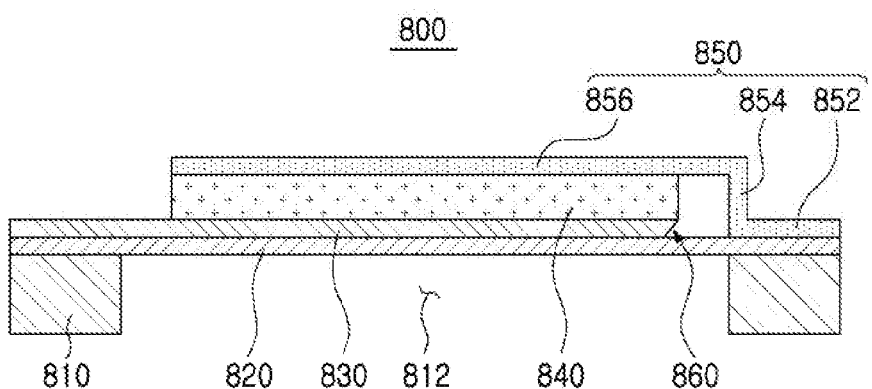
FIG. 10 is a schematic configuration view illustrating an example of a bulk acoustic wave resonator.

FIG. 10 is a schematic configuration view illustrating an example of a bulk acoustic wave resonator.

Referring to FIG. 10, a bulk acoustic wave resonator 800 includes a substrate 810, a membrane layer 820, a lower electrode 830, a piezoelectric layer 840, and an upper electrode 850. The membrane layer 820 forms a cavity 812 together with the substrate 810. The upper electrode 850 includes a support member 852, an extending part 854, and an electrode layer part 856.

Since the substrate 810, the membrane layer 820, the piezoelectric layer 840, and the upper electrode 850 are the same as the substrate 10, the membrane layer 20, the piezoelectric layer 140, and the upper electrode 50 described above with reference to FIGS. 1 and 3, a detailed description thereof will be omitted herein.

The lower electrode 830 is disposed on the membrane layer 820. The lower electrode 830 is formed on the membrane layer 820 such that a portion of the lower electrode 830 is disposed above the cavity 812. The lower electrode 830 has an end that does not coincide with the side of the piezoelectric layer 840 to form a reflection loss improving part 860. The end of the lower electrode 830 is inclined inward from the side of the piezoelectric layer 840 to form the reflection loss improving part 860. That is, the reflection loss may be reduced through the end of the lower electrode 830 that is inclined inward from the side of the piezoelectric layer 840. In other words, reflection performance of the lateral wave may be improved by a boundary difference between the side of the piezoelectric layer 840 and the end of the lower electrode 830 through the reflection loss improving part 860 as described above with reference to FIG. 10.

The lower electrode 830 may be formed of a conductive material such as molybdenum (Mo), ruthenium (Ru), tungsten (W), iridium (Ir), platinum (Pt), and the like, or alloys thereof.

The lower electrode 830 may be an input electrode that inputs an electrical signal such as a radio frequency (RF) signal, or the like, or an output electrode.

As described above with reference to FIG. 10, the reflection loss of the lateral wave may be reduced.

Figure 11:
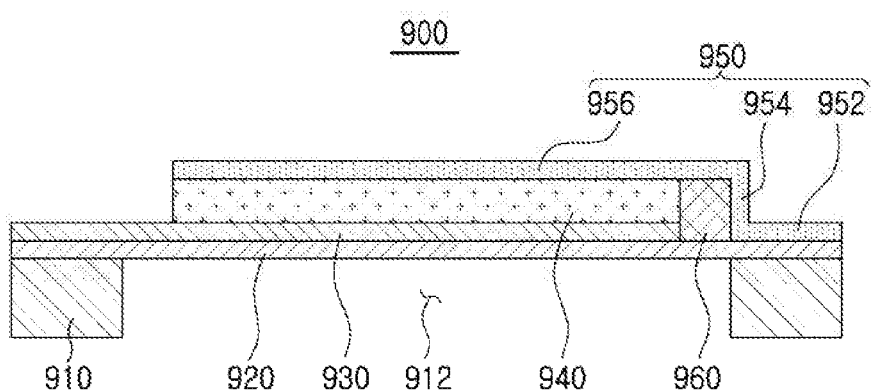
FIG. 11 is a schematic configuration view illustrating an example of a bulk acoustic wave resonator.

FIG. 11 is a schematic configuration view illustrating an example of a configuration of a bulk acoustic wave resonator.

Referring to FIG. 11, a bulk acoustic wave resonator 900 includes a substrate 910, a membrane layer 920, a lower electrode 930, a piezoelectric layer 940, an upper electrode 950, and a residual sacrificial layer 960. The membrane layer 920 forms a cavity 912 together with the substrate 910. The upper electrode 950 includes a support member 952, an extending part 954, and an electrode layer part 956.

Since the substrate 910, the membrane layer 920, the lower electrode 930, the piezoelectric layer 940, and the upper electrode 950 are the same as the substrate 10, the membrane layer 20, the lower electrode 30, the piezoelectric layer 140, and the upper electrode 50 described above with reference to FIGS. 1 and 3, a detailed description thereof will be omitted herein.

The residual sacrificial layer 960 is formed in a space formed by the membrane layer 920, the lower electrode 930, the piezoelectric layer 940, and the upper electrode 950. That is, the residual sacrificial layer 960 may surround one region of the piezoelectric layer 940 such that a medium having a large difference from a value of an acoustic impedance of a resonating part is disposed outside the piezoelectric layer 940.

At such a boundary, a reflection coefficient of the lateral wave may be affected by a shape of a boundary surface as well as the medium.

The shape of the boundary surface as well as the medium are changed by the residual sacrificial layer 960, so reflection performance for the lateral wave may be increased.

As described above, the reflection loss of the lateral wave may be reduced through the residual sacrificial layer 960.

Figure 12:
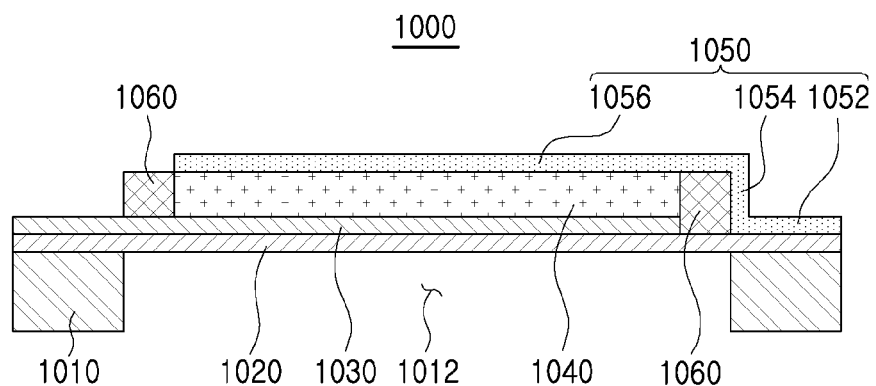
FIG. 12 is a schematic configuration view illustrating an example of a bulk acoustic wave resonator.

FIG. 12 is a schematic configuration view illustrating an example of a configuration of a bulk acoustic wave resonator.

Referring to FIG. 12, a bulk acoustic wave resonator 1000 includes a substrate 1010, a membrane layer 1020, a lower electrode 1030, a piezoelectric layer 1040, an upper electrode 1050, and a residual sacrificial layer 1060. The membrane layer 1020 forms a cavity 1012 together with the substrate 1010. The upper electrode 1050 includes a support member 1052, an extending part 1054, and an electrode layer part 1056.

Since the substrate 1010, the membrane layer 1020, the lower electrode 1030, the piezoelectric layer 1040, and the upper electrode 1050 are the same as the substrate 10, the membrane layer 20, the lower electrode 30, the piezoelectric layer 140, and the upper electrode 50 described above with reference to FIGS. 1 and 3, a detailed description thereof will be omitted herein.

The residual sacrificial layer 1060 surrounds the piezoelectric layer 1040. A portion of the residual sacrificial layer 1060 is formed in a space formed by the membrane layer 1020, the lower electrode 1030, the piezoelectric layer 1040, and the upper electrode 1050, like the residual sacrificial layer 960 in FIG. 11. A remaining portion of the residual sacrificial layer 1060 is exposed to the outside.

The reflection loss of the lateral wave is reduced through the residual sacrificial layer 1060.

Figure 13:
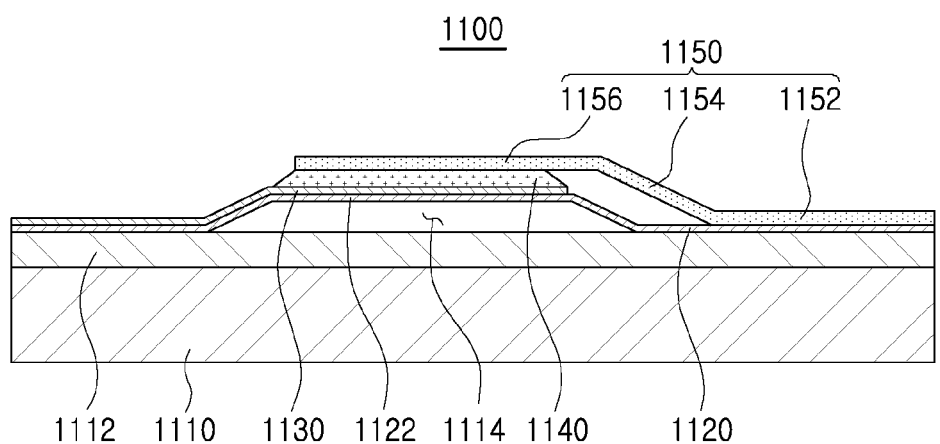
FIG. 13 is a schematic configuration view illustrating an example of a bulk acoustic wave resonator.

FIG. 13 is a schematic configuration view illustrating an example of a bulk acoustic wave resonator.

Referring to FIG. 13, a bulk acoustic wave resonator 1100 includes a substrate 1110, a substrate protective layer 1112, a membrane layer 1120, a lower electrode 1130, a piezoelectric layer 1140, and an upper electrode 1150.

The substrate 1110 may be a substrate including stacked silicon. For example, a silicon wafer may be used as the substrate. The substrate protective layer 1112 is disposed on the substrate 1110.

The substrate protective layer 1112, together with the membrane layer 1120, forms a cavity 1114.

The membrane layer 1120 is formed on a top surface of the substrate protective layer 1112, and, together with the substrate protective layer 1112, forms the cavity 1114. The membrane layer 1120 may prevent the lower electrode 1130 from being damaged by etching gas when a sacrificial layer (not shown) is removed during the manufacturing of the bulk acoustic wave resonator 1100. As an example, the membrane layer 1120 is formed of a material having low reactivity with halide-based etching gas. For example, the membrane layer 1120 is formed of a material containing silicon nitride (SiN) or silicon oxide ($SiO_2$).

The membrane layer 1120 may have a convex portion 1122 in an approximately central portion of the membrane layer 1120. The convex portion 1122, together with the substrate protective layer 1112, forms the cavity 1114. Edges of the convex portion 1122 are inclined relative to the top surface of the substrate protective layer 1112, and a flat surface is formed in a central portion of the convex portion 1122.

The lower electrode 1130 is disposed on the membrane layer 1120, and a portion of the lower electrode 1130 covers the flat surface of the convex portion 1122. As an example, the lower electrode 1130 is formed of a conductive material such as molybdenum (Mo), ruthenium (Ru), tungsten (W), iridium (Ir), platinum (Pt), or the like, or alloys thereof.

The lower electrode 1130 may be an input electrode that inputs an electrical signal such as a radio frequency (RF) signal, or the like, or an output electrode.

The piezoelectric layer 1140 is disposed on the flat surface of the lower electrode 1130. The piezoelectric layer 1140 is disposed such that an overall region of a side of the piezoelectric layer 1140 is exposed to the air. The side of the piezoelectric layer 1140 is inclined at an angle of 65° to 90° with respect to a top surface of the lower electrode 1130.

Accordingly, a lateral wave propagated in the piezoelectric layer 1140 may encounter the air at the side of the piezoelectric layer 140 and may increase a reflection coefficient.

During resonance driving of the bulk acoustic wave resonator 1100, the lateral wave having a plurality of modes may occur, and the lateral wave may propagate in a lateral direction in a form of various modes (S1, A1, S0, A0 modes, etc.) at an antiresonance frequency, which causes loss of energy. Accordingly, the bulk acoustic wave resonator 1100 may sequentially reflect these modes by exposing the side of the piezoelectric layer 1140 to the air.

Since the side of the piezoelectric layer 1140 is inclined at the angle of 65° to 90° with respect to the top surface of the lower electrode 1130, attenuation performance may be improved and a performance coefficient Q may be improved.

The upper electrode 1150 covers at least a portion of the piezoelectric layer 1140, and is formed so that the side of the piezoelectric layer 1140 is exposed to the air. The upper electrode 1150 may have a step shape. As an example, the upper electrode 1150 includes a support member 1152 formed on the membrane layer 1120 to be spaced apart from the lower electrode 1130, an extending part 1154 extended from the support member 1152 and spaced apart from the piezoelectric layer 1140, and an electrode layer part 1156 extended from the extending part 1154 and covering a top surface of the piezoelectric layer 1140.

The extending part 1154 is inclined relative to a top surface of the membrane layer 1120 at the same angle at which the edges of the convex portion 1122 are inclined relative to the top surface of the substrate protective layer 1112.

The upper electrode 1150 may be formed of a conductive material such as molybdenum (Mo), ruthenium (Ru), tungsten (W), iridium (Ir), platinum (Pt), or the like, or alloys thereof, similarly to the lower electrode 110.

The upper electrode 1150 may be an input electrode that inputs an electrical signal such as a radio frequency (RF) signal, or the like, or an output electrode. That is, in a case in which the lower electrode 1130 is the input electrode, the upper electrode 1150 may be the output electrode, and in a case in which the lower electrode 1130 is the output electrode, the upper electrode 1150 may be the input electrode.

As described above, the reflection loss of the lateral wave may be reduced.

As set forth above a bulk acoustic wave resonator capable of reducing the reflection loss of the lateral wave may be provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
   a substrate;
   a membrane layer disposed on the substrate and forming a cavity together with the substrate;
   a lower electrode disposed on the membrane layer and comprising a flat portion;
   a piezoelectric layer disposed on the flat portion of the lower electrode; and
   an upper electrode disposed on at least a portion of the piezoelectric layer,
   wherein an overall region of a side of the piezoelectric layer is exposed to air, the side of the piezoelectric layer is inclined at an angle of 65° to 90° with respect to a top surface of the lower electrode,
   the overall region of the side of the piezoelectric layer that is exposed to the air is an entire side of the piezoelectric layer all around the piezoelectric layer, and
   either (1) the upper electrode comprises a reflection loss improving part in which a bottom surface of the upper electrode ends at the side of the piezoelectric layer, and a top surface of the upper electrode ends before the side of the piezoelectric layer or extends beyond the side of the piezoelectric layer, or (2) the lower electrode comprises a reflection loss improving part in which a top surface of the lower electrode ends at the side of the piezoelectric layer, and a bottom surface of the lower electrode ends before the side of the piezoelectric layer or extends beyond the side of the piezoelectric layer.

2. The bulk acoustic wave resonator of claim 1, wherein the upper electrode comprises:
   a support member disposed on the membrane layer and spaced apart from the lower electrode;
   an extending part extended from a top surface of the support member in a direction perpendicular to the top surface of the support member, or in a straight line at an angle to the top surface of the support member, and spaced apart from the piezoelectric layer; and an electrode layer part extended from a top portion of the extending part and disposed on at least a portion of a top surface of the piezoelectric layer.

3. The bulk acoustic wave resonator of claim 1, wherein the membrane layer comprises a convex portion forming the cavity together with the substrate.

4. The bulk acoustic wave resonator of claim 3, wherein the convex portion comprises a flat portion,
   a portion of the lower electrode is disposed on the flat portion of the convex portion, and
   the piezoelectric layer is disposed on the lower electrode above the flat portion of the convex portion.

5. A bulk acoustic wave resonator comprising:
   a substrate;
   a membrane layer forming a cavity together with the substrate;
   a lower electrode disposed on the membrane layer and comprising a flat portion;
   a piezoelectric layer disposed on the flat portion of the lower electrode;
   an upper electrode disposed on at least a portion of the piezoelectric layer, and spaced apart from a side of the piezoelectric layer; and
   a residual sacrificial layer covering the side of the piezoelectric layer,
   wherein the residual sacrificial layer surrounds the side of the piezoelectric layer, and
   the residual sacrificial layer surrounding the side of the piezoelectric layer covers an entire side of the piezoelectric layer all around the piezoelectric layer.

6. The bulk acoustic wave resonator of claim 5, wherein the upper electrode comprises:
   a support member disposed on the membrane layer and spaced apart from the lower electrode;
   an extending part extended from a top surface of the support member in a direction perpendicular to the top surface of the support member, or in a straight line at an angle to the top surface of the support member, and spaced apart from the piezoelectric layer; and
   an electrode layer part extended from a top portion of the extending part and disposed on at least a portion of a top surface of the piezoelectric layer.

7. The bulk acoustic wave resonator of claim 5, wherein a portion of the residual sacrificial layer is disposed in a space defined by the membrane layer, the lower electrode, the piezoelectric layer, and the upper electrode.

8. The bulk acoustic wave resonator of claim 3, wherein the substrate comprises a substrate protective layer forming a top portion of the substrate,
   the membrane layer is disposed on the substrate protective layer, and
   the convex portion forms the cavity together with the substrate protective layer.

* * * * *